(12) United States Patent
Nagayama et al.

(10) Patent No.: US 12,165,896 B2
(45) Date of Patent: Dec. 10, 2024

(54) SUBSTRATE SUPPORT AND SUBSTRATE PROCESSING APPARATUS

(71) Applicant: Tokyo Electron Limited, Tokyo (JP)

(72) Inventors: Akira Nagayama, Miyagi (JP); Yasuharu Sasaki, Miyagi (JP); Taketoshi Tomioka, Miyagi (JP); Shin Yamaguchi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 721 days.

(21) Appl. No.: 17/273,009

(22) PCT Filed: Sep. 3, 2019

(86) PCT No.: PCT/JP2019/034582
§ 371 (c)(1),
(2) Date: Mar. 3, 2021

(87) PCT Pub. No.: WO2020/054508
PCT Pub. Date: Mar. 19, 2020

(65) Prior Publication Data
US 2021/0327741 A1    Oct. 21, 2021

(30) Foreign Application Priority Data
Sep. 14, 2018   (JP) .................................. 2018-172696

(51) Int. Cl.
*H01L 21/683*     (2006.01)
*H01J 37/32*      (2006.01)

(52) U.S. Cl.
CPC .... *H01L 21/6833* (2013.01); *H01J 37/32715* (2013.01)

(58) Field of Classification Search
None
See application file for complete search history.

(56) References Cited

U.S. PATENT DOCUMENTS

| | | | | |
|---|---|---|---|---|
| 2007/0215284 | A1* | 9/2007 | Oyabu | H01J 37/32009 118/728 |
| 2015/0340261 | A1* | 11/2015 | Katayama | G02F 1/1303 361/234 |
| 2018/0130689 | A1* | 5/2018 | Benjamin | H01L 21/6833 |
| 2018/0308736 | A1* | 10/2018 | Ramaswamy | H01L 21/68757 |
| 2021/0327741 | A1* | 10/2021 | Nagayama | H02N 13/00 |

FOREIGN PATENT DOCUMENTS

| | | |
|---|---|---|
| JP | H07-161803 | 6/1995 |
| JP | H08-330405 | 12/1996 |
| JP | 2003-060016 | 2/2003 |
| JP | 2003-115529 | 4/2003 |
| JP | 2003-282687 | 10/2003 |
| JP | 2005-026120 | 1/2005 |

(Continued)

*Primary Examiner* — Sylvia Macarthur
(74) *Attorney, Agent, or Firm* — IPUSA, PLLC (57) ABSTRACT

A substrate support is provided that includes: a base; an electrostatic chuck on which a substrate is placed; an electrode provided in the electrostatic chuck; a contact portion of the electrode; an adhesive layer that bonds the electrostatic chuck with the base and that does not cover the contact portion; and a power supply terminal contacting the contact portion of the electrode without being fixed to the contact portion.

12 Claims, 6 Drawing Sheets

(56) References Cited

FOREIGN PATENT DOCUMENTS

| | | | |
|---|---|---|---|
| JP | 2011-124377 | | 6/2011 |
| JP | 2014-072355 | | 4/2014 |
| JP | 2015207765 A | * | 11/2015 |
| JP | 2015-222748 | | 12/2015 |
| JP | 2015-225952 | | 12/2015 |
| JP | 2016-027601 | | 2/2016 |
| JP | 2016-051783 | | 4/2016 |
| JP | 2016051783 A | * | 4/2016 |
| JP | 2016-139503 | | 8/2016 |
| JP | 2016143795 A | * | 8/2016 |
| JP | 2018-082161 | | 5/2018 |
| KR | 10-2008-0046144 | | 5/2008 |
| KR | 10-2018-0057521 | | 5/2018 |

* cited by examiner

SUBSTRATE SUPPORT AND SUBSTRATE PROCESSING APPARATUS

TECHNICAL FIELD

The present disclosure relates to a substrate support and a substrate processing apparatus.

BACKGROUND

Patent Document 1 includes a terminal for supplying power to an electrode that electrostatically attracts a workpiece to a mounting table on which the workpiece is placed.

RELATED ART DOCUMENT

Patent Document

[Patent Document 1] Japanese Laid-open Patent Application Publication No. 2016-027601

SUMMARY

Problem to be Solved by the Invention

The present disclosure provides a structure for stably supplying power to an electrode.

Means for Solving Problem

According to one aspect of the present disclosure, a substrate support is provided that includes: a base; an electrostatic chuck on which a substrate is placed; an electrode provided in the electrostatic chuck; a contact portion of the electrode; an adhesive layer that bonds the electrostatic chuck with the base and that does not cover the contact portion; and a power supply terminal that contacts the contact portion of the electrode without being fixed to the contact portion.

Effect of Invention

According to one aspect, a structure that stably supplies power to an electrode can be provided.

DESCRIPTION OF EMBODIMENTS

Hereinafter, embodiments for carrying out the present disclosure will be described with reference to the drawings. In the present specification and drawings, substantially same structures are indicated by the same reference numerals, and overlapping descriptions may be omitted.

Configuration of Substrate Processing Apparatus

Figure 1:
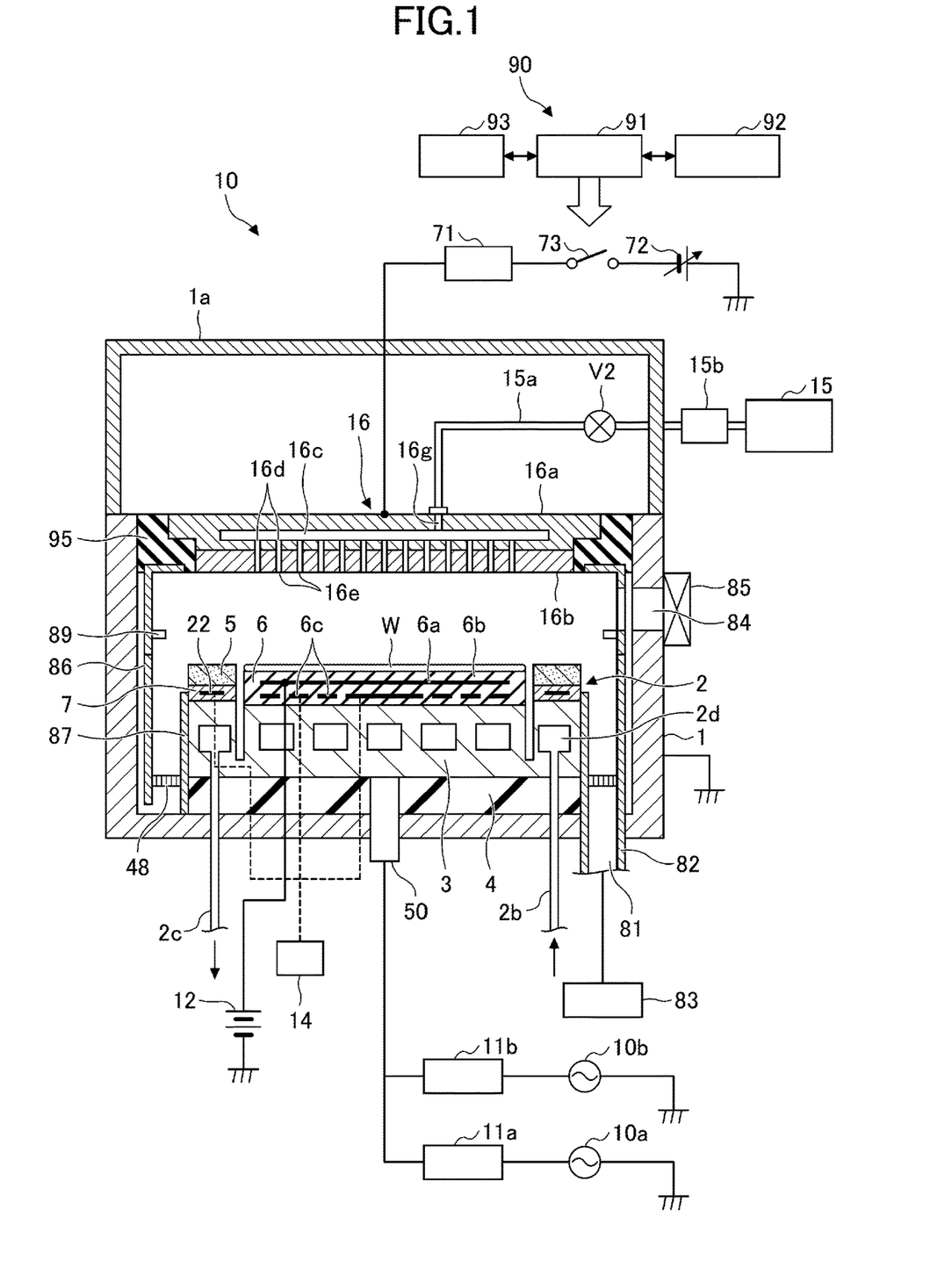
FIG. 1 is a diagram illustrating an example of a substrate processing apparatus according to an embodiment.

First, an example of the configuration of a substrate processing apparatus 10 according to one embodiment of the present disclosure will be described with reference to FIG. 1. In the present embodiment, a parallel plate capacitively coupled plasma processing apparatus will be described as an example of the substrate processing apparatus 10. However, the substrate processing apparatus 10 is not limited to a plasma processing apparatus. The substrate processing apparatus 10 may instead be a processing apparatus using heat that does not use a plasma, or may be a processing apparatus using light.

The substrate processing apparatus 10 includes a processing vessel 1 configured to be airtight and electrically grounded. The processing vessel 1 is cylindrical, and is made of, for example, aluminum. The processing vessel 1 defines a processing space in which a plasma is generated. In the processing vessel 1, a substrate support 2 that substantially horizontally supports a wafer W, which is an example of a substrate (workpiece), is accommodated. The substrate support 2 in the embodiment includes a base 3, an electrostatic chuck 6 on which a wafer W is placed, and a support member 7. The base 3 is generally cylindrical, and is made of a conductive metal such as aluminum. The base 3 also serves as a bottom electrode. The base 3 is supported by a support platform 4 made of an insulating material, and the support platform 4 is disposed at the bottom of the processing vessel 1. The base 3 is fastened to the support platform 4 from the back side, for example, via screws. The electrostatic chuck 6 is disposed at the center of the substrate support 2 in a plan view, and has a function for attracting a wafer W electrostatically.

The electrostatic chuck 6 includes a chuck electrode 6a and an insulating member 6b. The chuck electrode 6a is provided inside the insulating member 6b, and a direct-current (DC) power supply 12 is connected to the chuck electrode 6a. The chuck electrode 6a is connected to the DC power supply 12 via a power supply terminal, which will be described below.

When DC voltage is applied to the chuck electrode 6a from the DC power supply 12, the electrostatic chuck 6 electrostatically attracts a wafer W by Coulomb force. The electrostatic chuck 6 is provided with one or more heater electrodes 6c (heater electrodes on the side of the electrostatic chuck 6) which are heating elements. The heater electrodes 6c are connected to a heater power supply 14. The heater electrodes 6c extend annularly, for example, to surround the center of the substrate support 2. The heater electrodes 6c may include, for example, a heater that heats the central region and a heater that annularly extends around the outer portion of the central region. In this case, the temperature of the wafer W may be controlled for each region located in the radial direction relative to the center of the wafer W.

An annular edge ring (may also be referred to as a focus ring) 5 is provided at the outside of the electrostatic chuck 6. The edge ring 5 may be formed of, for example, monocrystalline silicon, and is supported by the base 3 via a support member 7. Inside the support member 7, a heater electrode 22 (heater electrode on the side of the edge ring 5) which is a heating element is provided. The heater electrode 22 controls the temperature of the edge ring 5. The heater electrode 22 may be connected to the heater power supply 14, or to another heater power supply. The heater power supply 14 may be configured such that supply of power to the heater electrode 6c and the heater electrode 22 is turned on and off by using an on/off switch. Thus, the temperature of the wafer W and the temperature of the edge ring 5 are independently controlled by different heaters.

A power supply rod 50 is connected to the base 3. To the power supply rod 50, a first radio frequency (RF) power supply 10a is connected via a first matching device 11a, and a second RF power supply 10b is connected via a second matching device 11b. The first RF power supply 10a is a power source for plasma generation, and radio frequency power at a predetermined frequency is supplied from the first RF power supply 10a to the base 3 of the substrate support 2. The second RF power supply 10b is a power source for drawing ions (for biasing), and radio frequency power at a frequency lower than the first RF power supply 10a is supplied from the second RF power supply 10b to the base 3 of the substrate support 2.

A refrigerant passage 2d is formed inside the base 3, and a refrigerant inlet tube 2b and a refrigerant outlet tube 2c are connected to the refrigerant passage 2d. By circulating, in the refrigerant passage 2d, a refrigerant such as cooling water or a heat transfer medium, the substrate support 2 is controlled at a predetermined temperature. A gas supply line for supplying, to the back surface of the wafer W, a gas (backside gas) for transferring cryogenic heat, such as helium gas, may be provided, so as to penetrate the substrate support 2. The gas supply line is connected to a gas supply source. According to these configurations, the wafer W attracted to and held by the electrostatic chuck 6 of the substrate support 2 is controlled at a predetermined temperature.

A showerhead 16, which has a function as an upper electrode, is provided above the substrate support 2. The showerhead 16 faces the substrate support 2 and is parallel to the substrate support 2. The showerhead 16 and the substrate support 2 function as a pair of electrodes (upper electrode and lower electrode).

The showerhead 16 is provided at the top wall of the processing vessel 1. The showerhead 16 includes a main body 16a and an upper top plate 16b forming an electrode plate, and is supported to the top of the processing vessel 1 via an insulating member 95. The main body 16a is made of an electrically conductive material, e.g., aluminum with an anodized surface, and the upper top plate 16b is removably supported thereunder.

Inside the main body 16a, a gas diffusion chamber 16c is provided. At the bottom of the main body 16a, a large number of gas flow holes 16d located at the bottom of the gas diffusion chamber 16c and in communication with the gas diffusion chamber 16c are formed. In the upper top plate 16b, gas introduction holes 16e are provided so as to penetrate the upper top plate 16b in a thickness direction. The gas introduction holes 16e are disposed at locations communicating with the above-described respective gas flow holes 16d. According to such a configuration, a process gas supplied to the gas diffusion chamber 16c is dispersed in a shower-like manner in the processing vessel 1, through the gas flow holes 16d and the gas introduction holes 16e.

A gas inlet 16g for introducing a process gas into the gas diffusion chamber 16c is formed at the main body 16a. A gas supply line 15a is connected to the gas inlet 16g, and a process gas supply source 15 for supplying the process gas is connected to the other end of the gas supply line 15a. The gas supply line 15a is provided with a mass flow controller (MFC) 15b and an open/close valve V2 in sequence from the upstream side. The process gas for plasma etching is supplied from the process gas supply source 15 to the gas diffusion chamber 16c via the gas supply line 15a, and is dispersed from the gas diffusion chamber 16c in a shower-like manner in the processing vessel 1, through the gas flow holes 16d and the gas introduction holes 16e.

A variable DC power supply 72 is electrically connected to the showerhead 16 as the upper electrode, via a low pass filter (LPF) 71. The variable DC power supply 72 is configured to turn on and turn off supplying power by an on/off switch 73. The current and voltage of the variable DC power supply 72 and on/off control of the on/off switch 73 are controlled by a controller 90, which will be described below. When a plasma is generated in the processing space by applying radio frequencies from the first RF power supply 10a and the second RF power supply 10b to the substrate support 2, the on/off switch 73 is turned on by the controller 90 as necessary. Also, predetermined DC voltage is applied to the showerhead 16 as the upper electrode.

A cylindrical grounding conductor 1a is provided so as to extend above the height location of the showerhead 16, from the side wall of the processing vessel 1. The cylindrical grounding conductor 1a has a top wall at the top of the cylindrical grounding conductor 1a.

An exhaust port 81 is formed at the bottom of the processing vessel 1, to which an exhaust device 83 is connected via an exhaust pipe 82. The exhaust device 83 includes a vacuum pump. By operating the vacuum pump, the pressure in the processing vessel 1 can be reduced to a predetermined vacuum level. At the side wall of the processing vessel 1, a loading/unloading port 84 for a wafer W is provided, and a gate valve 85 that opens/closes the loading/unloading port 84 is provided at the loading/unloading port 84.

A deposition shield 86 is provided on the inner side of the processing vessel 1 along the inner wall surface. The deposition shield 86 prevents etching by-products from adhering to the processing vessel 1. A conductive member (GND block) 89 is provided at a height location of the deposition shield 86 substantially the same as the height of the wafer W. The GND block 89 is provided at the deposition shield 86 such that an electrical potential relative to the ground may be controlled, thereby preventing abnormal discharge. A deposition shield 87, which extends along the outer side of the substrate support 2, is also provided. The deposition shields 86 and 87 are configured to be removable. At an exhaust path having an annular shape in a plan view, which is positioned between the deposition shields 86 and 87, a baffle plate 48 is provided. The baffle plate 48 may be constructed by, for example, coating an aluminum material with a ceramic such as $Y_2O_3$. The exhaust port 81 is provided below the baffle plate 48.

Operations of the substrate processing apparatus having the above-described configuration is controlled comprehensively by the controller 90. The controller 90 includes a process controller 91 equipped with a CPU, which controls various parts of the substrate processing apparatus, a user interface 92, and a memory 93.

The user interface 92 includes a keyboard for performing an operation of inputting a command by a process manager to manage the substrate processing apparatus, a display for displaying an operating status of the substrate processing apparatus visually, and the like.

The memory 93 stores a control program (software) for implementing various processes executed by the substrate processing apparatus under control of the process controller 91, and recipes in which processing condition data or the like are recorded. By loading a desired recipe from the memory 93 and by causing the recipe to be executed in the process controller 91 in accordance with an instruction from the user interface 92 when necessary, desired processing is performed in the substrate processing apparatus under the control of the process controller 91. In addition, the control program and the recipe such as processing condition data may be used in a state in which the control program and the recipe are stored in a computer-storage medium readable by a computer (e.g., a hard disk drive, a CD, a flexible disk, or a semiconductor memory). Alternatively, the control program and the recipe may be used online, by transmitting the control program and the recipe from another device through a dedicated line for example, as necessary.

Essential Structure of Substrate Support

Figure 2:
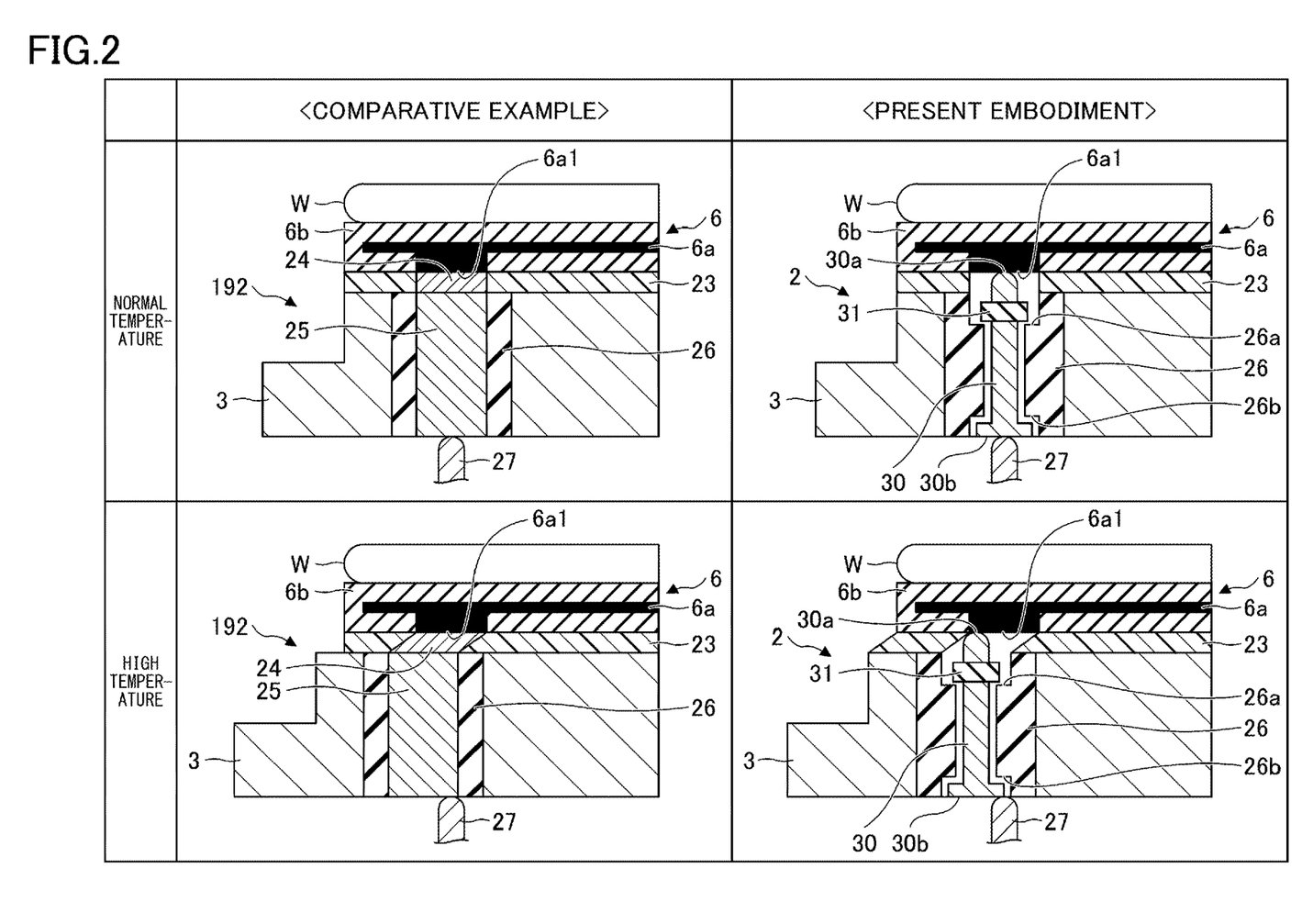
FIG. 2 is a view illustrating an example of the structure of a power supply terminal in a substrate support according to the embodiment and an example of the structure of a power supply terminal in a substrate support according to a comparative example.

Next, with reference to FIG. 2, the essential structure of the substrate support 2 according to one embodiment will be described, while comparing with a substrate support according to a comparative example. The left column of FIG. 2 illustrates schematic cross-sectional views each illustrating a power supply portion of a chuck electrode 6a in a substrate support 192 according to the <comparative example>. The right column of FIG. 2 illustrates schematic cross-sectional views each illustrating a power supply portion of the chuck electrode 6a of the substrate support 2 according to the <present embodiment>. In FIG. 2, the heater electrode 6c is omitted for convenience of illustration.

Both the substrate support 192 and the substrate support 2 include a base 3, an electrostatic chuck 6, an insulating adhesive layer 23 by which the electrostatic chuck 6 is bonded onto the base 3, and a chuck electrode 6a provided in the electrostatic chuck 6.

In the substrate support 192 according to the comparative example, an insulator 26 is formed of an insulating material such as a resin, and insulates the base 3 from a conductive member 25 filled in the insulator 26. The bottom end of the conductive member 25 contacts a contact probe 27, and the top end of the conductive member 25 contacts a contact portion 6a1 of the chuck electrode 6a via a conductive adhesive 24. Accordingly, DC voltage is supplied via the contact probe 27.

In the substrate support 192 according to the comparative example, the conductive member 25 and the chuck electrode 6a are bonded in some manner, such as with the conductive adhesive 24 or a brazing material. With such a configuration, as illustrated in the bottom row of the comparative example, when the temperature of the substrate support 192 becomes higher than the normal temperature illustrated in the upper row of the comparative example, the base 3 expands outward relative to the electrostatic chuck 6 due to the difference in the coefficient of linear thermal expansion between the electrostatic chuck 6 made of an insulating material and the base 3 made of aluminum. As a result, in a case in which the conductive adhesive 24 contacts the contact portion 6a1 of the chuck electrode 6a outside the center of the electrostatic chuck 6, the conductive adhesive 24 is distorted as the contact portion 6a1 deviates from the conductive member 25, and internal stress is generated in the conductive adhesive 24.

When a plasma process applied to a wafer W is repeated in the processing vessel 1, a temperature cycle of a high temperature and a normal temperature (low temperature) is repeated, and the conductive adhesive 24 formed of conductive rubber or the like deteriorates. As a result, stable power supply to the chuck electrode 6a becomes difficult. In particular, in processes of recent years, a range of the temperature change between the high temperature and the low temperature is expanding, and magnitude the DC voltage applied to the chuck electrode 6a and magnitude of the radio frequency power applied to the base 3 are increasing. Accordingly, the internal stress repeatedly generated in the conductive adhesive 24 due to the difference in the coefficient of linear thermal expansion between the electrostatic chuck 6 and the base 3 becomes larger, and deterioration of the conductive adhesive 24 bonded to the contact portion 6a1 of the chuck electrode 6a has become a major problem.

Therefore, in the substrate support 2 according to the present embodiment illustrated in the right column of FIG. 2, the conductive adhesive 24 is eliminated and is replaced with a movable contact that is movable relative to the contact portion 6a1 of the chuck electrode 6a. Accordingly, it is possible to provide a structure for stably supplying power to the chuck electrode 6a even if stresses are repeatedly generated due to the difference in the coefficient of linear thermal expansion between the electrostatic chuck 6 and the base 3.

Specifically, the substrate support 2 according to the present embodiment does not have the conductive adhesive 24. That is, the portion in which the conductive adhesive 24 was embedded becomes a through-hole, and the contact portion 6a1 at the lower surface of the chuck electrode 6a is exposed.

In this configuration, the substrate support 2 according to the present embodiment includes the base 3, the electrostatic chuck 6, an insulating adhesive layer 23, a chuck electrode 6a, and a power supply terminal 30. The power supply terminal 30 contacts the contact portion 6a1 of the chuck electrode 6a while the power supply terminal 30 is not fixed (is movable) to the contact portion 6a1 of the chuck electrode 6a.

The power supply terminal 30 is provided inside the insulator 26. The insulator 26 is a hollow member, and forms a thorough-hole penetrating the base 3. Because a potential difference occurs between the chuck electrode 6a and the base 3, the insulator 26 is formed of an insulating member that can withstand the potential difference, such as alumina or a resin.

Accordingly, a through-hole penetrating the base 3 and the insulating adhesive layer 23 is formed in the base 3, and the power supply terminal 30 is accommodated inside the through-hole. The insulator 26 insulates the power supply terminal 30 from the base 3. The bottom end 30b of the power supply terminal 30 contacts the contact probe 27, so that the power supply terminal 30 and the contact probe 27 are electrically connected. Thus, DC voltage supplied from the DC power supply 12 is applied to the chuck electrode 6a from the power supply terminal 30 via the contact probe 27.

The power supply terminal 30 is a rod-like member. The top end 30a of the power supply terminal 30 is rounded, and the bottom end 30b extends radially. Accordingly, even if the power supply terminal 30 is inclined or the contact probe 27 deviates, due to expansion of the chuck electrode 6a and the base 3, contact between the bottom end 30b of the power supply terminal 30 and the contact probe 27 can be maintained.

Further, if the temperature of the substrate support becomes higher than the normal temperature illustrated in the upper row of the present embodiment due to the difference in the coefficient of linear thermal expansion between the electrostatic chuck 6 and the base 3, the base 3 expands outward relative to the electrostatic chuck 6 as illustrated in the lower part. Even in this case, because the top end 30a of the power supply terminal 30 according to the present embodiment is in point contact with the contact portion 6a1 of the chuck electrode 6a in a state in which the power supply terminal 30 is not fixed to the contact portion 6a1, internal stress does not occur between the power supply terminal 30 and the chuck electrode 6a. Thus, it is possible to stably supply power to the chuck electrode 6a.

Stepped portions 26a and 26b are provided on the inner circumference of the insulator 26. The stepped portions 26a and 26b form a constriction in which the inner diameter of the insulator 26 in a range between the stepped portions 26a and 26b is smaller than the inner diameter of the insulator 26 at a region outside the range between the stepped portions 26a and 26b.

The power supply terminal 30 is inserted into a C-shaped ring member 31, and the C-shaped ring member 31 is locked so that the lower surface of the C-shaped ring member 31 is positioned at a position slightly closer to the top end 30a of the power supply terminal 30 than the stepped portion 26a. The outer diameter of the C-shaped ring member 31 is greater than the inner diameter of the constriction. Therefore, because the C-shaped ring member 31 serves as a stopper for the power supply terminal 30, the C-shaped ring member 31 can prevent the power supply terminal 30 from being dropped from the base 3. The inner diameter of the constriction is larger than the outer diameter of the power supply terminal 30 (excluding the bottom end 30b). This prevents the power supply terminal 30 from interfering with the insulator 26.

The power supply terminal 30 may be provided with an O-shaped ring member instead of the C-shaped ring member 31. In a case of using the C-shaped ring member 31 and in a case of using the O-shaped ring member, a groove is formed at a portion of the power supply terminal 30 to which the C-shaped or O-shaped ring member is attached, and the ring member is fitted into the groove.

Figure 3:
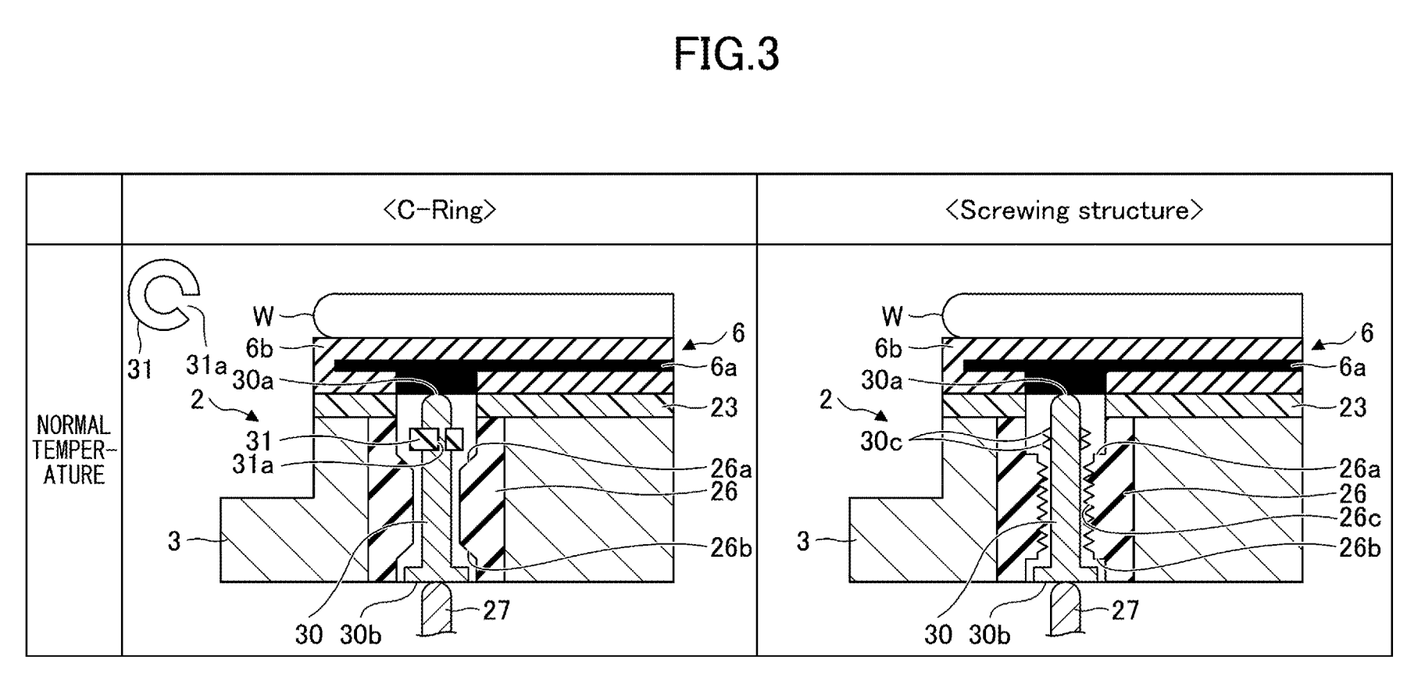
FIG. 3 is a view illustrating an example of a stopper structure of the power supply terminal according to the embodiment.

However, as illustrated in <C-Ring> at the left column of FIG. 3, because the C-shaped ring member 31 has a split 31a, the C-shaped ring member 31 is more easily deformed than the O-shaped ring member. Therefore, when the power supply terminal 30 is inserted into the constriction of the insulator 26, the C-shaped ring member 31 is deformed along the stepped portion 26b of a tapered shape, and when the power supply terminal 30 passes through the constriction, in a space provided on the upper portion of the stepped portion 26a, the shape of the C-shaped ring member 31 is restored. Accordingly, by employing the C-shaped ring member 31 made of an elastically deformable resin, there is an advantage that a stopper structure for the power supply terminal 30 is easily formed.

The stopper structure according to the present embodiment is not limited to that using the C-shaped ring member 31 illustrated in the left column. The stopper structure may have a <screwing structure> illustrated in the right column of FIG. 3. In the case of the screwing structure, a female screw thread 26c is formed on the constriction in the insulator 26, and the diameter of the space above the stepped portion 26a is greater than the diameter of the space in which the female screw thread 26c is formed. A male screw thread 30c having a diameter corresponding to the diameter of the female screw thread 26c is provided near the top end 30a of a power supply terminal 30.

When the male screw thread 30c is screwed into the female screw thread 26c while the power supply terminal 30 is inserted into the constriction of the insulator 26, the male screw thread 30c passes through the space above the constriction, and thereby the male screw thread 30c serves as a stopper. This prevents the power supply terminal 30 from being dropped from the base 3.

In the present embodiment, the top end 30a of the power supply terminal 30 is rounded. Therefore, the power supply terminal 30 is in point contact with the contact portion 6a1 of the chuck electrode 6a. As a result, variation in a size of a contact area between other power supply terminals 30 can be reduced. It is preferable that the top end 30a of the power supply terminal 30 is formed in a shape in which the top end 30a is in point contact with the contact portion 6a1 of the chuck electrode 6a. However, the shape is not limited thereto, and the top end 30a may be formed into any shape, such as a tapered shape or a flat shape.

In the present embodiment, as a material of the top end 30a of the power supply terminal 30, a material softer than the chuck electrode 6a is used. That is, the hardness of the top end 30a of the power supply terminal 30 is smaller than that of the chuck electrode 6a of the electrostatic chuck 6. Accordingly, because the substrate support is configured such that the power supply terminal 30, which can be replaced easier, abrades earlier when damaged by friction is given, it is possible to preferentially protect the electrostatic chuck 6 (chuck electrode 6a), which is difficult to replace. For example, the hardness of the top end 30a of the power supply terminal 30 may be approximately HV (Vickers hardness) 10 to 2500, and the hardness of the chuck electrode 6a of the electrostatic chuck 6 may be approximately HV 2000 to 2500.

Figure 4:
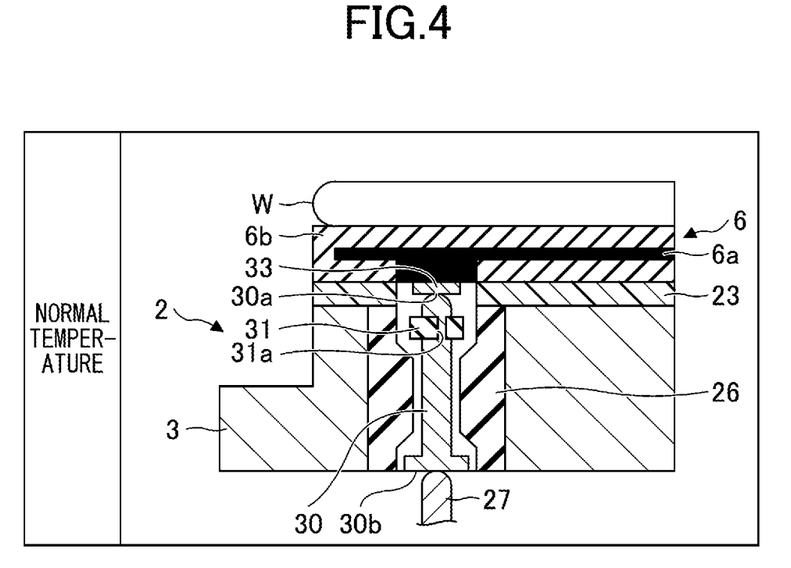
FIG. 4 is a view illustrating an example of a contact portion of the power supply terminal according to the embodiment.

Further, as illustrated in FIG. 4, a contact plate 33 may be attached to the surface of the chuck electrode 6a of the electrostatic chuck 6, so that the contact plate 33 functions as a contact portion for the chuck electrode 6a. In this case, the top end 30a of the power supply terminal 30 comes in point contact with the contact plate 33. In such a configuration, as the power supply terminal 30 does not directly contact the chuck electrode 6a, damage to the chuck electrode 6a can be further prevented.

Figure 5:
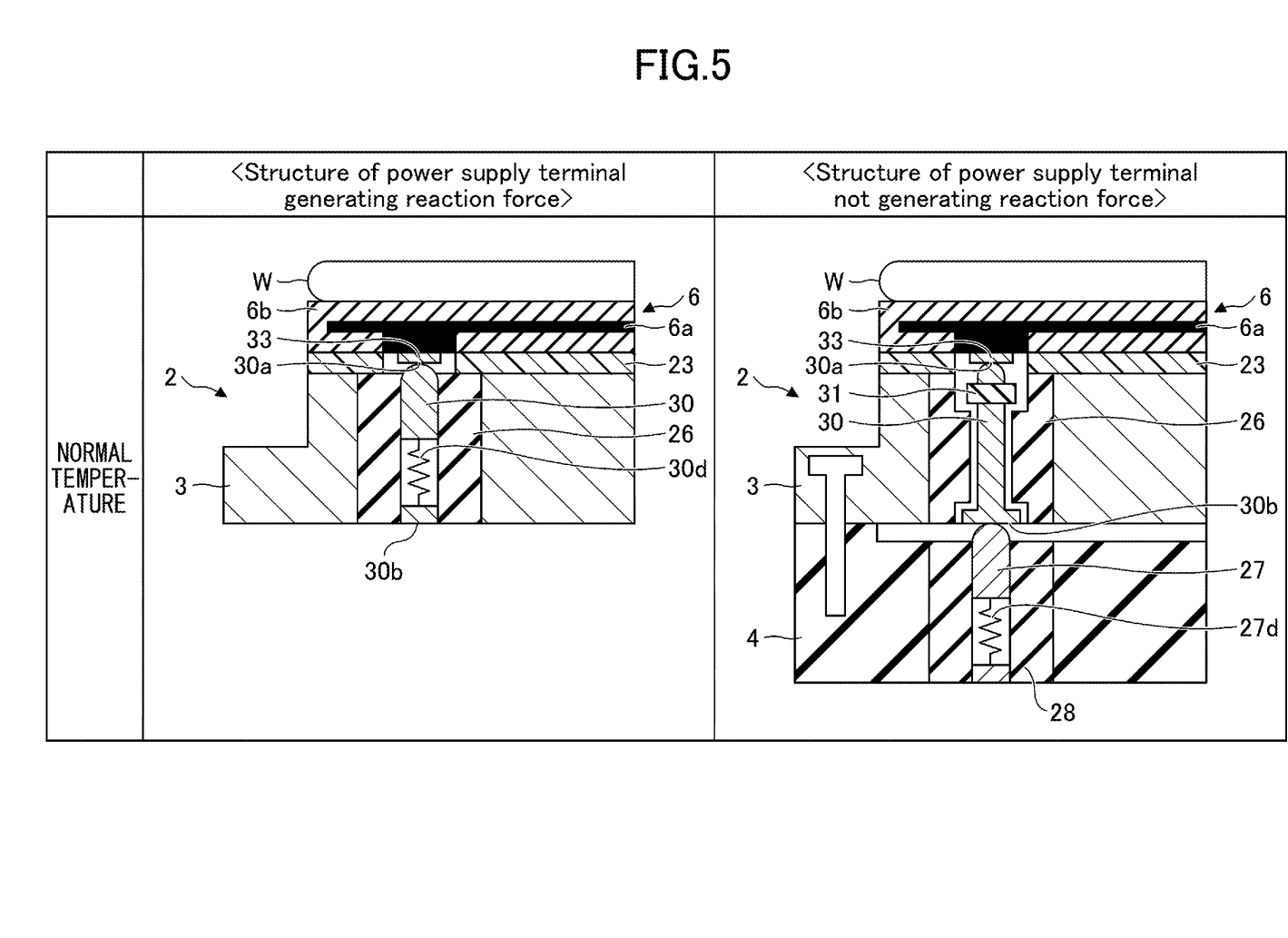
FIG. 5 is a view illustrating an example of a spring structure of the power supply terminal or an example of a contacting member according to the embodiment.

As illustrated in <Structure of power supply terminal generating reaction force> at the left column of FIG. 5, the power supply terminal 30 may have a spring structure in which a reactive force is exerted inside the terminal. For example, a spring member 30d that can be expanded and compressed in the vertical direction may be provided in the power supply terminal 30. As a result, because the power supply terminal 30 is expanded and contracted in the vertical direction due to the reaction force of the spring member 30d, contact between the top end 30a and the contact plate 33 (or the contact portion 6a1) can be secured, and thus DC voltage can be supplied to the chuck electrode 6a more stably.

Although the structure illustrated in the left column of FIG. 5 does not have a stopper structure, it is preferable to have a stopper structure as illustrated in FIG. 3 in addition to the spring structure. When the power supply terminal 30 expands and interferes with the insulator 26, free movement of the power supply terminal 30 is restricted. This may result in the loss of conduction to the chuck electrode 6a. Therefore, it is preferable to provide a space between the power supply terminal 30 and the insulator 26.

As illustrated in <Structure of power supply terminal not generating reaction force> at the right column of FIG. 5, the power supply terminal 30 may be configured not to generate reaction force in the power supply terminal 30. In this case, a spring member 27d that can be expanded and compressed in the vertical direction may be provided within the contact probe 27, which is inserted in an insulator 28 that penetrates the support platform 4 and that communicates with a space in the insulator 26. In this case, the contact probe 27 is expanded and compressed in the vertical direction by the reaction force of the spring member 27d. As a result, the power supply terminal 30 can be pushed up from the contact probe 27 side to ensure contact between the top end 30a of the power supply terminal 30 and the contact plate 33 (or contact portion 6a1), and DC voltage can be supplied to the chuck electrode 6a more stably.

Finally, examples of materials that can be used for each member are described below. However, each of the specific metals, resins, and ceramics indicated are merely examples, and suitable materials are not limited to the specified materials.

Power supply terminal 30
   Metal (aluminum, titanium, stainless steel, copper, etc.)
Contact plate 33
   Metal (aluminum, titanium, stainless steel, copper, etc.)
Insulator 26
   Ceramic (alumina, zirconia, etc.)
   Resin (vespel, PEEK (polyether ether ketone), PCTFE (Neoflon), PTFE (polytetrafluoroethylene))
C-shaped ring member 31
   Resin (vespel, PEEK, PCTFE, PTFE)
   Metal (aluminum, titanium, stainless steel, copper, etc.)

Figure 6:
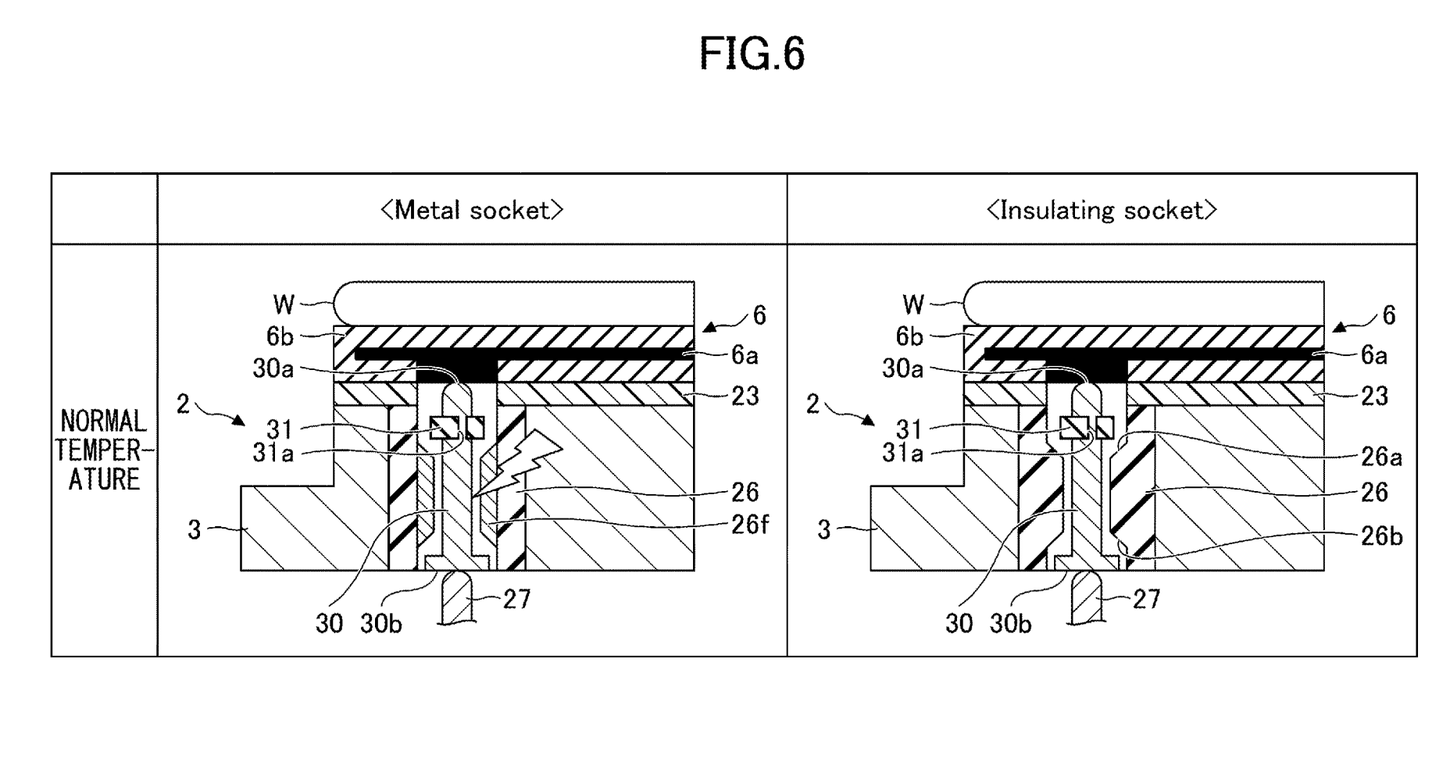
FIG. 6 is a view illustrating an example of a socket penetrating the substrate support according to the embodiment.

In particular, as illustrated in <Metal socket> at the left column of FIG. 6, if the inner peripheral side of the insulator 26 is formed of a metal member 26f, discharge may occur between the power supply terminal 30 made of a metal and the metal member 26f of the insulator 26. In contrast, as illustrated in <Insulating socket> at the right column of FIG. 6, if the insulator 26 is formed of an insulating material such as a ceramic or resin, discharge does not occur between the power supply terminal 30 made of a metal and the insulator 26 made of an insulating material. Thus, the insulator 26 is preferably formed of an insulating material rather than a metal.

Variations

In the above description, a case in which the power supply terminal 30 is provided so as to contact the chuck electrode 6a of the electrostatic chuck 6 to supply DC voltage is described. However, the present invention is not limited thereto. For example, the power supply terminal 30 may be used when the power supply terminal 30 is brought into contact the heater electrode 6c on the side of the electrostatic chuck 6, which is provided in the substrate support 2, to supply alternating-current (AC) voltage from the heater power supply 14 to the heater electrode 6c. Thus, the electrode provided in the electrostatic chuck 6 includes the chuck electrode 6a and the heater electrode 6c, and the power supply terminal 30 can be used to supply power to one or both of the chuck electrode 6a and the heater electrode 6c.

The power supply terminal 30 may be used to supply power to at least one of the heater electrode 22 on the side of the edge ring 5 provided at the edge ring 5 and an electrode on the edge ring 5 side (not illustrated) for electrostatically attracting the edge ring 5 to the base 3.

Further, the power supply terminal 30 may be provided at a contact portion between the substrate support 2, which functions as a lower electrode, and the power supply rod 50.

In any variations, the power supply terminal 30 contacts a contact portion of an electrode without being fixed to the contact portion. Accordingly, even if a deviation occurs between members near the power supply terminal 30 due to the difference in coefficient of linear thermal expansion between the members near the power supply terminal 30 as a result of a temperature cycle of a high temperature and a low temperature, the top end 30a of the power supply terminal 30 contacts the contact portion of the electrode by moving to a position corresponding to the deviation. Thus, it is possible to provide a structure that stably supplies power to an electrode.

The substrate support and the substrate processing apparatus according to one embodiment disclosed herein should be considered examples in all respects and not restrictive. The above embodiment may be modified and enhanced in various forms without departing from the appended claims and the gist thereof. Matters described in the above embodiment may take other configurations to the extent not inconsistent, and may be combined to the extent not inconsistent.

The substrate processing apparatus of the present disclosure is applicable to any types of Capacitively Coupled Plasma (CCP), Inductively Coupled Plasma (ICP), Radial Line Slot Antenna (RLSA), Electron Cyclotron Resonance Plasma (ECR), and Helicon Wave Plasma (HWP).

The present specification has described a case in which a wafer is an example of a substrate. However, the substrate may not be limited thereto, but may be various types of substrate, such as substrates used in an FPD (Flat Panel Display), and a printed circuit board.

This international application is based on and claims priority to Japanese Patent Application No. 2018-172696, filed on Sep. 14, 2018, the entire contents of which are incorporated herein by reference.

DESCRIPTION OF SYMBOLS

1 Processing vessel
2 Substrate support
3 Base
4 Support platform
5 Edge ring
6 Electrostatic chuck
6a Chuck electrode
6a1 Contact portion
6c Heater electrode
10 Substrate processing apparatus
12 DC power supply
14 Heater power supply
15 Process gas supply source
16 Showerhead
22 Heater electrode
26 Insulator
27 Contact probe
27d Spring member
30 Power supply terminal
30d Spring member
31 Ring member
33 Contact plate

What is claimed is:
1. A substrate support comprising:
a base;
a hollow insulator, the hollow insulator having a central longitudinal axis;

an electrostatic chuck on which a substrate is placed, the electrostatic chuck being positioned on the base; the electrostatic chuck including an electrode, the electrode including a contact portion;

an adhesive layer that bonds the electrostatic chuck with the base and that does not cover the contact portion, the adhesive layer being provided between the electrostatic chuck and the base; and a first power supply terminal being positioned within a through-hole, the through-hole passing through the base and the adhesive layer, and extending from a bottom surface of the base to a bottom surface of the electrostatic chuck;

wherein the first power supply terminal includes a tip portion that releasably contacts the contact portion and a bottom end located on an opposite side of the tip portion, which includes a bottom surface of the first power supply;

wherein the hollow insulator includes a first step located at a top of the hollow insulator, a second step located at a bottom of the hollow insulator, and an intermediate portion extending from the first step to the second step;

wherein the bottom end of the first power supply terminal is wider than a middle portion of the first power supply terminal, the middle portion extending from the tip portion to the bottom end; and wherein the intermediate portion has a thickness, measured perpendicular to the central longitudinal axis, that is greater than a thickness of both the first step and the second step such that the intermediate portion of the hollow insulator mates with the middle portion of the first power supply terminal.

2. The substrate support according to claim 1, further comprising a stopper structure that holds the first power supply terminal in the through-hole.

3. The substrate support according to claim 2, wherein the through-hole is formed of an insulator installed in the base, the insulator having an insulating property.

4. The substrate support according to claim 2, wherein the stopper structure includes a ring member attached to an outer circumference of the power supply terminal; and
an outer diameter of the ring member is greater than a diameter of a narrowed portion of the through-hole.

5. The substrate support according to claim 2, wherein the stopper structure is a screwing structure including a male screw thread formed on the first power supply terminal and a female screw thread formed in the through-hole; and the power supply terminal is screwed into the through-hole.

6. The substrate support according to claim 1, wherein the contact portion of the electrode is a contact plate attached to the surface of the electrode.

7. The substrate support according to claim 1, wherein the first power supply terminal includes a spring structure that can be expanded and compressed in a vertical direction.

8. The substrate support according to claim 1, wherein a bottom end of the first power supply terminal is connected to a contact member that can be expanded and compressed in a vertical direction.

9. The substrate support according to claim 1, wherein the electrode provided in the electrostatic chuck includes a chuck electrode and a heater electrode; and
the first power supply terminal contacts, without being fixed, a contact portion of either the chuck electrode, the heater electrode, or both.

10. The substrate support according to claim 1, wherein an edge ring is disposed at an outer periphery of the base; the base is configured to function as a bottom electrode; and
a second power supply terminal contacts, without being fixed, either contact portion of an electrode for the edge ring, a contact portion of the bottom electrode, or both.

11. The substrate support according to claim 1, wherein the first power supply terminal has a length that is equal to a lengthwise thickness of the through-hole.

12. A substrate processing apparatus comprising:
a processing vessel; and
a substrate support including
a base;
a hollow insulator, the hollow insulator having a central longitudinal axis;
an electrostatic chuck on which a substrate is placed, the electrostatic chuck being positioned on the base; the electrostatic chuck including an electrode, the electrode including a contact portion;
an adhesive layer that bonds the electrostatic chuck with the base and that does not cover the contact portion, the adhesive layer being provided between the electrostatic chuck and the base; and
a first power supply terminal being positioned within a through-hole, the through-hole passing through the base and the adhesive layer, and extending from a bottom surface of the base to a bottom surface of the electrostatic chuck;
wherein the first power supply terminal includes a tip portion that releasably contacts the contact portion and a bottom end located on an opposite side of the tip portion, which includes a bottom surface of the first power supply:
wherein the hollow insulator includes a first step located at a top of the hollow insulator, a second step located at a bottom of the hollow insulator, and an intermediate portion extending from the first step to the second step;
wherein the bottom end of the first power supply terminal is wider than a middle portion of the first power supply terminal, the middle portion extending from the tip portion to the bottom end; and
wherein the intermediate portion has a thickness, measured perpendicular to the central longitudinal axis, that is greater than a thickness of both the first step and the second step such that the intermediate portion of the hollow insulator mates with the middle portion of the first power supply terminal.

* * * * *